United States Patent [19]

Oshida et al.

[11] Patent Number: 4,993,837
[45] Date of Patent: Feb. 19, 1991

[54] METHOD AND APPARATUS FOR PATTERN DETECTION

[75] Inventors: Yoshitada Oshida, Fujisawa; Yasuhiro Yoshitake, Yokohama; Naoto Nakashima, Shiga; Masataka Shiba, Yokohama, all of Japan

[73] Assignee: Hitachi, Ltd., Tokyo, Japan

[21] Appl. No.: 301,962

[22] Filed: Jan. 25, 1989

[30] Foreign Application Priority Data

Jan. 25, 1988 [JP] Japan .................... 63-12505

[51] Int. Cl.$^5$ .............. G01B 11/00; G01N 21/86
[52] U.S. Cl. ..................... 356/401; 250/548
[58] Field of Search .................... 356/399–400, 356/401; 250/548, 557, 561

[56] References Cited

U.S. PATENT DOCUMENTS 4,668,089  5/1987  Oshida et al. ............ 356/152
4,865,455  9/1989  Kohno et al. ............ 356/400

FOREIGN PATENT DOCUMENTS 59-186324  4/1983  Japan .
60-136312  7/1985  Japan .

Primary Examiner—F. L. Evans
Assistant Examiner—K. P. Hantis
Attorney, Agent, or Firm—Antonelli, Terry, Stout & Kraus

[57] ABSTRACT

A method and a system for pattern detection are disclosed in which a laser beam high in directivity is emitted from a laser beam source, the laser beam emitted from the laser beam source is irradiated on an uneven pattern to be detected on an object, the light component of a frequency corresponding to the cut-off frequency of an objective lens is removed from the light reflected from the object when an image of the pattern on the object is formed through an objective lens, the optical image thus formed is received by a photoelectric converting device for producing a signal waveform representing the pattern free of a signal of the frequency corresponding to the cut-off frequency, and the pattern is detected from a signal produced from the photoelectric converting device.

35 Claims, 11 Drawing Sheets

F I G. 2A
F I G. 2B
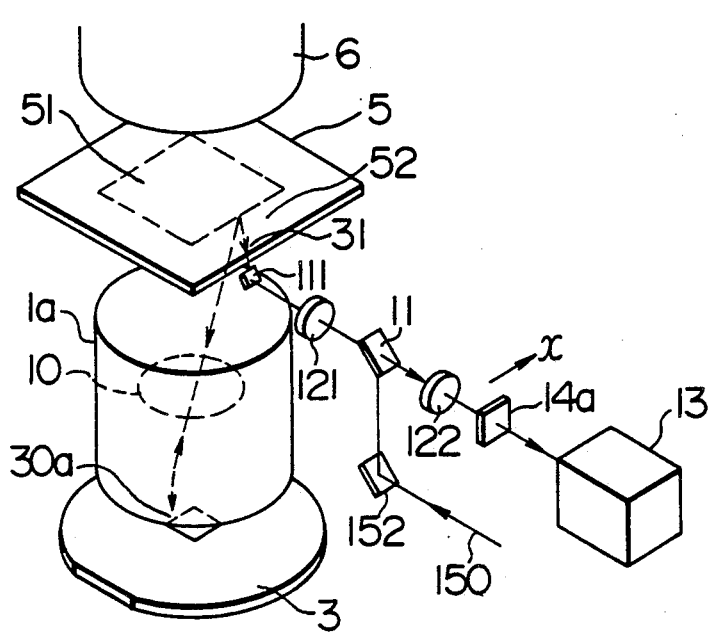
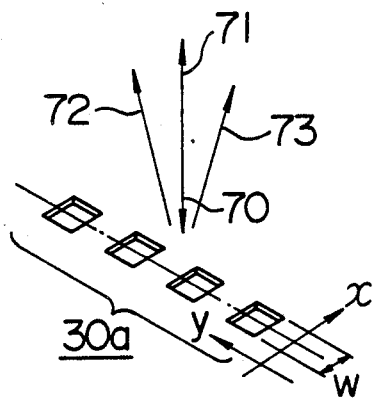
F I G. 2C
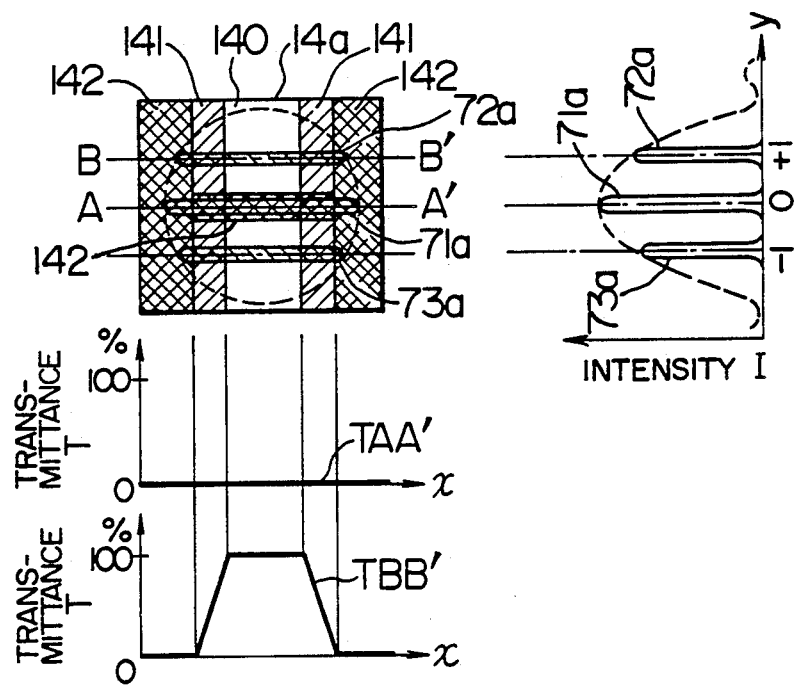

FIG. 8

| NO | OSCILLATION METHOD | MTF | EXAMPLE OF RESOLUTION PATTERN |
|---|---|---|---|
| 1 | | | |
| 2 | | | |
| 3 | | | |
| 4 | | | |
| 5 | | | |

F I G. 10
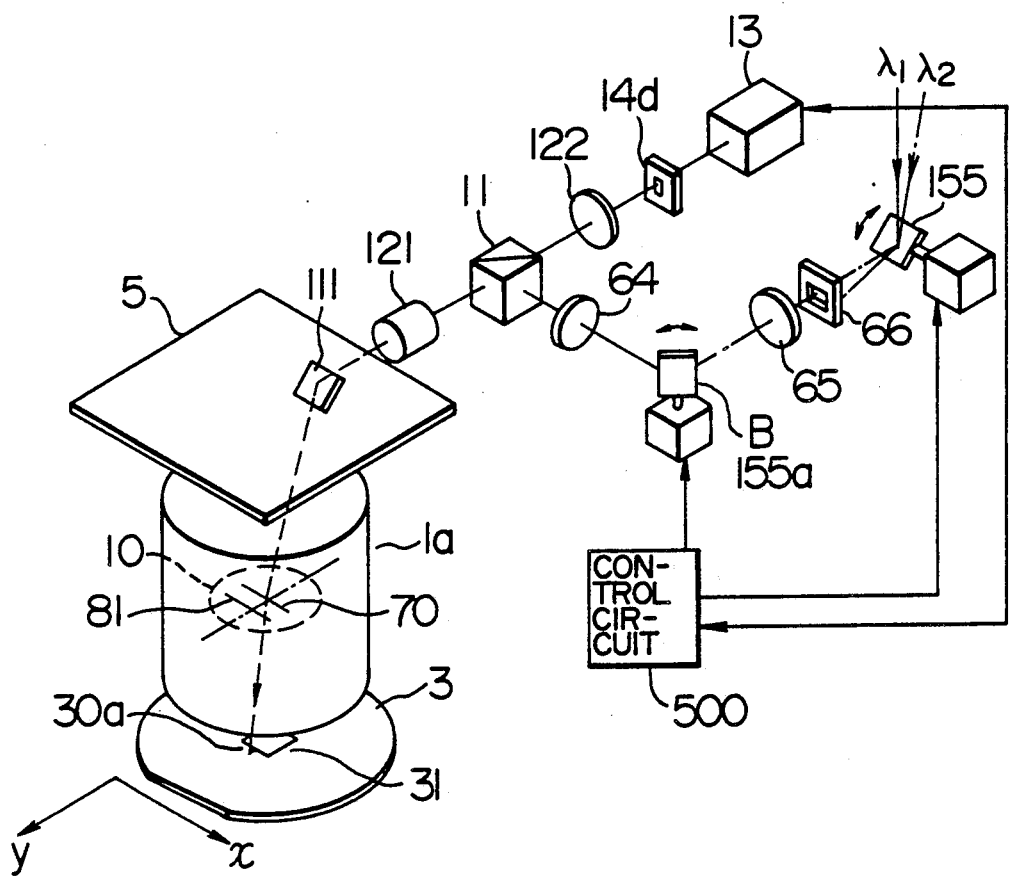
F I G. 12
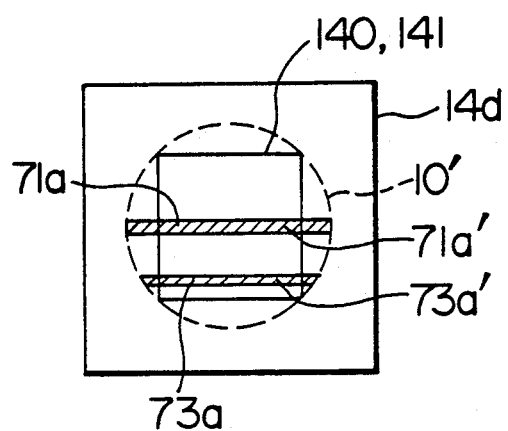

METHOD AND APPARATUS FOR PATTERN DETECTION

BACKGROUND OF THE INVENTION

The present invention relates to a method and an apparatus for detecting a pattern formed on a substrate by use of a laser beam of high illuminance and directivity (spatial coherence) as an irradiation light, or more in particular such a method and an apparatus for detecting an alignment pattern on a substrate in a TTL (Through The Lens) alignment of a reduction projection exposure system.

A conventional pattern detection apparatus is disclosed, for example, in JP-A-60-136312 (U.S. Pat. No. 4,668,089) as shown in FIG. 6. This conventional apparatus uses a laser beam high in illuminance and directivity (spatial coherence) as an irradiation light. When an object pattern is illuminated by laser beam, however, the reflected light has a component along the angle of diffraction from the direction of regular reflection representing the spatial frequency of the pattern of the object, and therefore the high frequency component is sharply cut by the spatial frequency corresponding to the outer periphery of the pupil (or the numerical aperture) of the detection optical system. Insertion of a spatial filter of such a sharp cutting characteristic generates a noise in the form of a vibration oscillation corresponding to the spatial frequency thus cut in the detected waveform, thereby posing the problem of the original pattern being deformed.

SUMMARY OF THE INVENTION

Accordingly, the primary object of the present invention is to provide a method and an apparatus for pattern detection in which in order to solve the abovementioned problems of the conventional apparatuses, an object is illuminated with a laser beam of high illuminance and directivity thereby to detect a pattern of the object without superimposition of a cut-off frequency, thus making possible a high-precision pattern detection with a detection signal of a high S/N faithful to the original pattern.

Another object of the present invention is to provide a method and an apparatus for detecting a substrate position of reduction projection type in which the position of a TTL substrate alignment mark of a reduction projection exposure system is detected without being effected by an irregular photoresist coating thereby realizing a high-precision alignment with a detection signal of an alignment pattern of high S/N.

According to the present invention, there is provided a method and an apparatus for pattern detection comprising a filter having a transmittance effectively changing along the direction of detection of an edge alignment pattern on an object (perpendicular to the longitudinal direction of a one-dimensional pattern) around a position of a regularly reflected component of the reflected light obtained by illumination of the object with a laser beam of high directivity, imaging means for forming an image of the object by use of light from the object transmitted through the filter, and means for detecting the alignment pattern on the object of detection, wherein the change in transmittance of the filter along the direction of pattern detection eliminates a specific cut-off frequency from the detection waveform, thereby producing a smoothed faithful detection waveform with a sharp change only at or in the vicinity of an edge of the original pattern, so that the signal-to-noise ratio of the detection signal is improved, thereby assuring an accurate pattern and position detection.

According to another aspect of the present invention, there is provided a method and an apparatus for pattern detection wherein a laser beam is illuminated on an object to be detected and oscillated along the direction of detection (perpendicular to the longitudinal direction of a one-dimensional pattern) in such a fashion that the regularly reflected portion of the illumination light from the object surface or the mean plane of the object is distributed symmetrically with respect to a straight line (center line of pupil) passing through the pupil center of an objective lens, thereby effectively capturing an object image within the oscillation time of the laser beam.

By controlling the illumination light in such a manner as to oscillate along the direction of detection to assure a symmetric distribution of the regularly-reflected portion of the illumination light from the object surface with respect to the straight line passing through the pupil center of the objective lens (center line of pupil) as described above, a specific cut-off frequency is eliminated from the MTF (modulation transfer function) as seen from Nos. 4 and 5 in FIG. 8 on the one hand and the frequency characteristic is extended to a high frequency region on the other. As a result, a detection waveform of high resolution is obtained without any specific frequency noise. If the oscillation along the direction of detection is not accurately symmetrical, the detection waveform develops asymmetry as shown in No. 3 of FIG. 8, thus making it impossible to detect the center of symmetry, that is, the center position of the pattern. For this reason, it is important to control the oscillatory illumination along the direction of detection in a manner to assure an always symmetric distribution of the regularly-reflected light from the object surface with respect to the straight line passing through the pupil center of the objective lens.

BRIEF DESCRIPTION OF THE DRAWINGS

FIG. 2A is a diagram showing an embodiment of the present invention applied to the detection of wafer alignment of an exposure system of reduction projection type.

FIG. 2B is a diagram showing in an enlarged form the relationship between a dotted alignment pattern on a wafer and the incident and reflected light.

FIG. 2C shows the relationship between a diffracted light image and an alignment pattern on the analog spatial filter of FIG. 2A.

FIG. 8 is a diagram for explaining the functions of the present invention.

FIG. 10 is a diagram showing another embodiment of the present invention as applied to the detection of water alignment pattern of an exposure system of reduction projection type.

FIGS. 11A and 11B, 12, and 13A and 13B are diagrams showing the direction of incidence of illumination light to the object in the embodiment shown in FIG. 10, a diagram for explaining a spatial filter and diagrams for explaining the MTF of the detection waveform obtained, respectively.

DESCRIPTION OF THE PREFERRED EMBODIMENTS

Figure 1A:
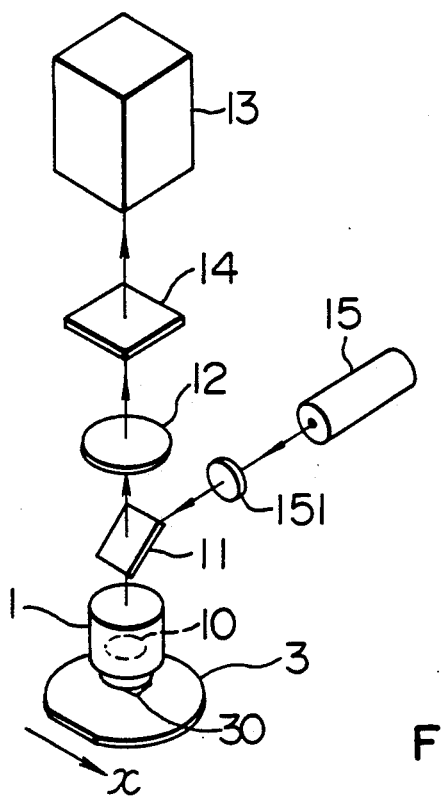
FIG. 1A is a diagram showing a construction of the apparatus according to an embodiment of the present invention.

A first embodiment of the present invention will be explained with reference to FIGS. 1A, 1B and 1C. A laser beam of high illuminance and high directivity emitted from a laser beam source 15 is passed through a lens 151 and a beam splitter 11 and is focused on a pupil 10 of an objective lens 1, thereby being irradiated on an object 30 to be detected on a wafer 3. The laser beam reflected on the object 30 is passed through the objective lens and a relay lens 12 thereby to form an image of the object 30 on an imaging device 13. The relay lens 12 forms the image of the pupil 10 on a spatial filter 14. The analog spatial filter 14, as shown in FIG. 1B, has regions 140 and 142 thereof transmitting substantially 100% and 0% (masking) of the laser beam respectively. In the regions 141, the transmittance T varies from one point to another as shown in the graph of FIG. 1B. By so doing, the beam reflected from the object 30 is prevented from being sharply cut at a specific spatial frequency, so that a smooth pattern image of the object 30 faithful to the original pattern not superimposed with a specific cut-off spatial frequency is detected by the imaging device 13.

Figure 1B:
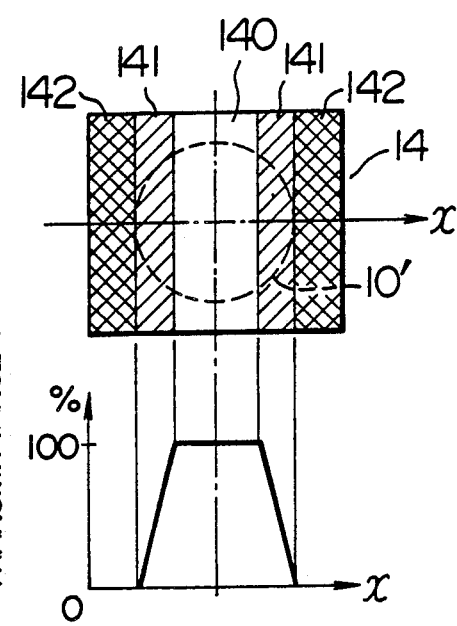
FIG. 1B is a diagram showing general characteristics of an analog spatial filter of FIG. 1A.
Figure 1C:
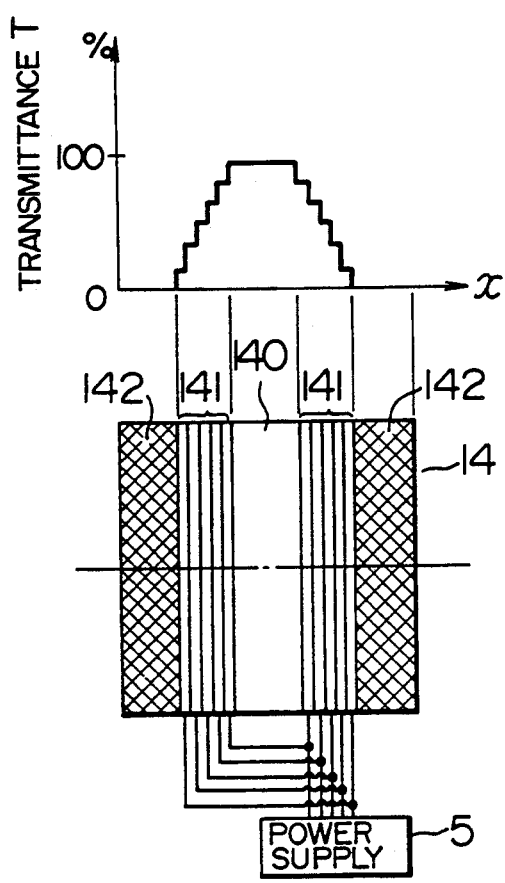
FIG. 1C shows an embodiment of the analog spatial filter.

The analog spatial filter 14 is specifically illustrated in FIG. 1C. Upon application of a voltage to a ferroelectric material such as PLZT or liquid crystal by a transparent electrode, the light transmittance of the part impressed with the voltage is controllable. If a region 141 is divided into a multiplicity of bands and the voltage applied to each band from a power supply 5 is appropriately controlled, the transmittance T can be changed in steps, thus obtaining a substantially linear transmittance characteristic as shown in FIG. 1B.

Figure 6A:
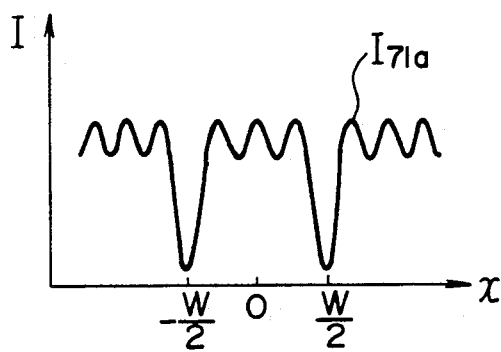
FIG. 6A shows a signal waveform along the direction X of the regularly reflected light 71a superimposed with a spatial frequency obtained in FIG. 2C.
Figure 6B:
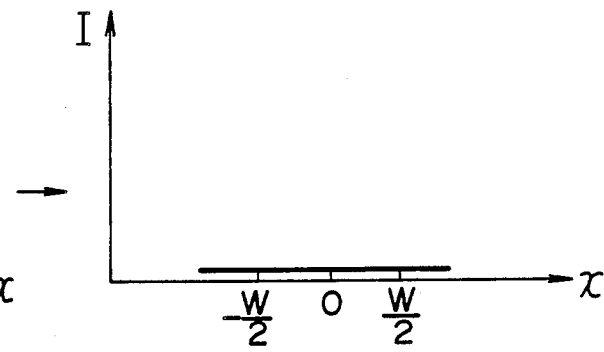
FIG. 6B shows a signal waveform of FIG. 6A passed through an analog spatial filter.
Figure 6C:
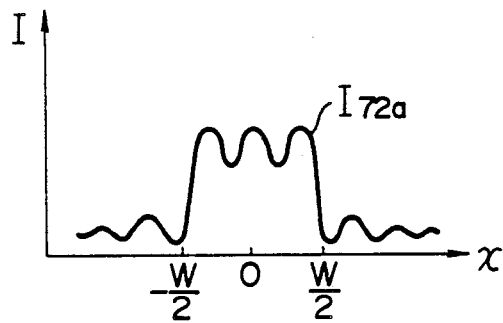
FIG. 6C is a diagram showing a signal waveform along the direction X of the diffracted light 72a superimposed with a spatial frequency obtained in FIG. 2C.
Figure 6D:
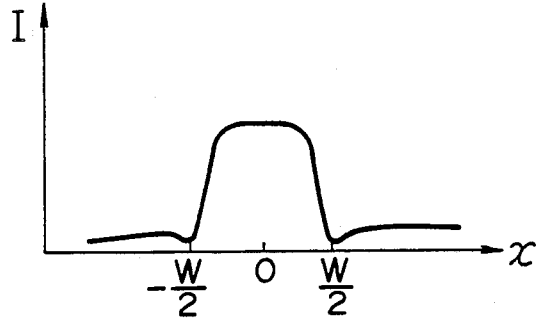
FIG. 6D is a diagram showing a signal waveform of FIG. 6C as passed through an analog spatial filter.

FIG. 2A is a diagram showing a second embodiment of the present invention applied to an alignment detection system of a reduction projection exposure system. In this embodiment, an alignment pattern 30a on the object is comprised of periodically-arranged dot marks shown in FIG. 2B, and the positions in X direction of these marks are detected. Reference numeral 1a designates a reduction projection lens, numeral 5 a mask (reticle) plotted with a circuit pattern 51, and numeral 6 an exposure illumination system. A laser beam 150 having a high illuminance and a high directivity is reflected on a mirror 152 and a half mirror 11, and then passing through a lens 121, is reflected on a mirror 111 and a chromium surface (opaque pattern surface) 52 on the reticle 5. The beam thus reflected is passed through a reduction projection lens 1a to form a beam 70 for illuminating alignment marks 30a formed around the exposure region (scribe area) on the wafer (substrate) 3 providing an object to be detected. The alignment marks 30a are irradiated in their entirety by the illumination beam 70, and a regularly-reflected beam 71 and diffracted beams 72, 73 are directed from the alignment marks 30a toward the pupil 10 of the reduction projection lens 1a again. The image of the dotted alignment marks 30a, following the illumination light path reversely, is formed on a part 31 by the reduction projection lens 1a, and further through lenses 121, 122, reaches a position on the analog spatial filter 14a in conjugate relationship with the pupil 10 of the reduction projection lens 1a to form a regularly-reflected light image (zero-order diffracted light image) 71a (see FIG. 2C), $\pm 1$ order diffracted light image 72a, $-1$ order diffracted light image 73a and $\pm 2$ order diffracted light images (not shown). The light images thus formed are masked partially by an analog spatial filter 14a, and the light images not masked are detected by the imaging means 13. In this way, the analog spatial filter 14a mounted in the detection light path is such that as shown in FIG. 2C, the light is cut off by a portion $T_{AA'}$ having the transmittance T of 0% along the line A—A', while along the line B—B', like in the embodiment of FIG. 1B, the transmittance is almost 100% and 0% for the regions 140 and 142 respectively and varies from one point to another in the regions 141. Of all the light beams reflected on the dotted alignment marks 30a, the regularly-reflected light image 71a shown in FIG. 6A is masked (shielded) at A—A' of the analog spatial filter 14a in the manner shown in FIG. 6B, and the diffracted light image 72a (+1 order diffracted light) shown in FIG. 6C is transmitted at B—B'. Thus only the diffracted light is transmitted through the analog spatial filter and a smooth light image faithful to the original pattern not superimposed with any cut-off spatial frequency as shown in FIG. 6D is detected by the imaging means 13. In this way, by detection of only the diffracted light, the contrast between the marks and the surrounding wafer is enhanced as shown in FIG. 6C. The high-frequency component in FIG. 6C is generated when the high-frequency component of the diffracted light is cut off at a spatial frequency corresponding to the outer periphery of pupil (the numerical aperture NA) of reduction projection lens 1a, and is removed when the diffracted light is transmitted through analog spatial filter 14a, thereby producing a smooth wave-form faithful to the original signal having a sharp contrast at the edge of the dot marks as shown in FIG. 6D.

Figure 3A:
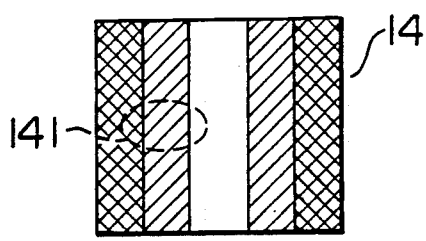
FIG. 3A is a diagram showing a spatial filter having half-tone regions 141 formed by a binary transmittance pattern.
Figure 3B:
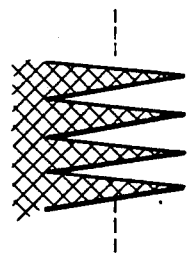
FIGS. 3B, 3C and 3D are diagrams showing binary transmittance patterns usable in the spatial filter of FIG. 3A.
Figure 3C:
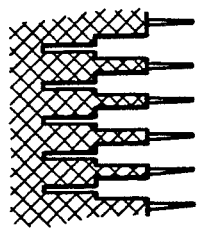
Figure 3D:
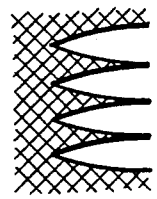

FIG. 3A shows a spatial filter having the same function as the analog spatial filter 14 in FIG. 1A. This filter has half-tone regions 141 formed by a binary transmittance pattern. Specifically, as shown in FIGS. 3B, 3C and 3D, a binary transmittance pattern (with the transmittance including two values of almost 100% and 0%) is finely plotted in the half-tone areas 141, so that the transmittance is changed effectively in accordance with the change in X-direction position in this area. As a result, the transmittance effectively varies from 0 to 100% along the points of X direction, thus producing an effect similar to the aforementioned embodiment.

Figure 4A:
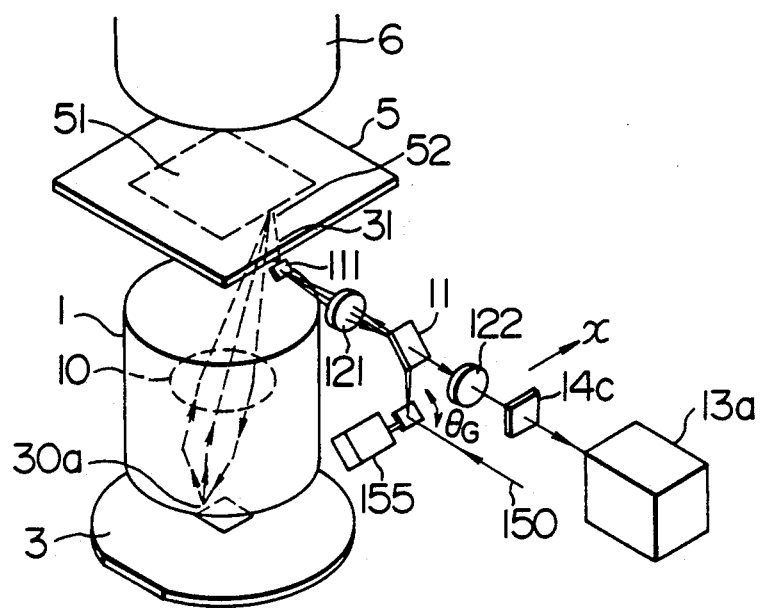
FIG. 4A shows an embodiment of the present invention applied to the detection of a wafer alignment of an exposure system of reduction projection type.
Figure 4B:
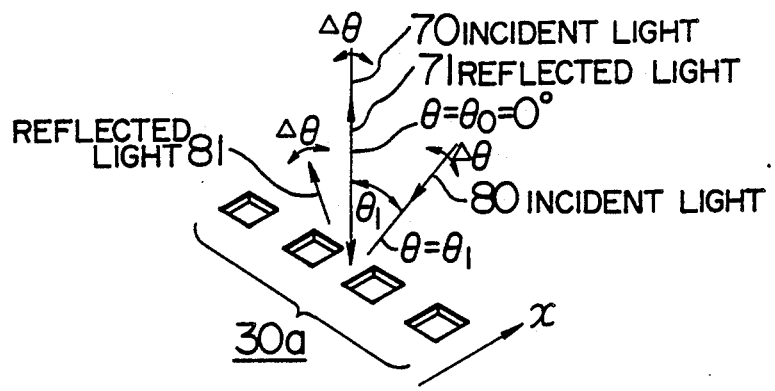
FIG. 4B is a diagram showing in an enlarged form the relationship between a dotted alignment pattern and the incident and regularly reflected light on the wafer.
Figure 4C:
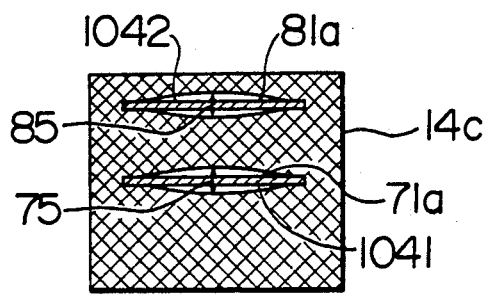
FIG. 4C is a diagram showing the relationship between the spatial filter and the detection of a regularly reflected light.
Figure 4D:
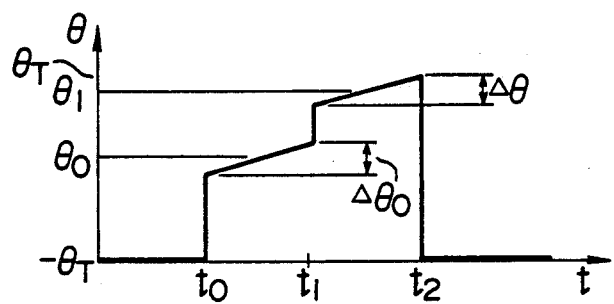
FIG. 4D shows the relationship between the oscillation $\theta$ of incident light and time t.

FIGS. 4A, 4B, 4C and 4D are diagrams showing another embodiment of the present invention, in which the component parts identical to those included in FIGS. 2A, 2B and 2C are designated by the same reference numerals respectively. A laser beam 150 is slightly deflected by a galvanomirror 155, and dotted alignment marks 30a are irradiated with oscillated illumination light 70, 80 deflected within the range of angular changes $\Delta\theta$ around predetermined incident angles $\theta_0$ and $\theta_1$. The regularly-reflected light 71, 81 illuminated on the dotted alignment marks 30a within the range of $\Delta\theta$ around the angles of $\theta=\theta_0=0°$ (normal or perpendicular illumination) and $\theta=\theta_1$ enter the shell-shaped ( -shaped) parts 1041 and 1042 of a shell-shaped filter 14C in FIG. 4C as regular-reflection images 71a and 81a respectively. The changing oscillation angle $\Delta\theta$ causes images 71a and 81a to move relative to shell-shaped parts 1041 and 1042 in the directions of arrows 75 and 85, respectively, causing the spatial cut-off frequency of spatial filter 14c to change as the effective width of shell-shaped parts 1041 and 1042 changes with the changing oscillation angle $\Delta\theta$. Therefore, the detection signal produced at an image storage imaging means 13a during oscillatory illumination is a sum of images cut off at different cut-off frequencies other, thus producing a smooth wave-form faithful to the original pattern. FIG. 4D is a graph showing the chronological change of incident angle of the illumination to the object marks 30a with the deflection of the galvanomirror 155.

Figure 5A:
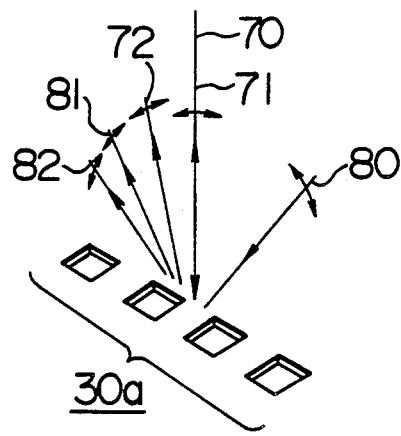
FIG. 5A is a diagram showing in an enlarged form the relationship between the dotted alignment pattern and the incident light and the light diffracted and reflected.
Figure 5B:
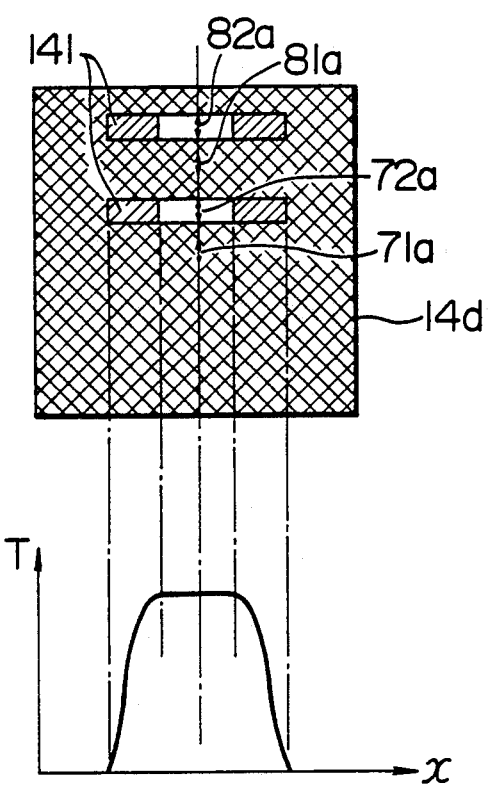
FIG. 5B shows an analog spatial filter for detecting the diffracted light and the diffracted light transmitted through the filter in relation to FIG. 5A.
Figure 5C:
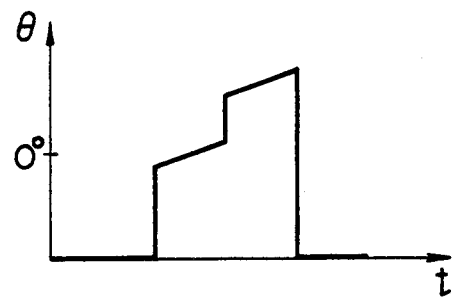
FIG. 5C is a diagram showing the relationship between the oscillation $\theta$ of the incident light and the time t.

FIG. 5 is a diagram showing another embodiment of the present invention which uses the same optical system as the embodiment of FIG. 4A except for the points described below. Specifically, the spatial filter 14d has two half-tone areas 141 hatched in FIG. 5B, and the transmittance varies nonlinearly from 0 to 100% along the direction of detection depending on the points involved. The intermediate part of the region (white portion) represents the transmittance of 100%, and the other (part indicated by ) 0%. As shown in FIG. 5A, the marks 30a on the wafer having a pattern of dots with predetermined pitches, which are irradiated with laser beams of perpendicular incident light 70 and oblique incident light 80 are illuminated by the deflection of the galvanomirror 155 in a manner similar to the embodiment of FIG. 4A. The images of the first order diffraction lights 72a and 82a from the dot marks 30a enter the half-tone region 141 of the spatial filter, and images are formed in the image storage imaging device 13a by the light passed through the half-tone areas 141. In this case, only the diffraction light images from the marks are detected by the image storage imaging device 13a. The regularly-reflected light images 71a and 81a are not detected.

According to an embodiment of the present invention, two or three different wavelengths are used as the incident light shown in FIGS. 4A and 5A. In this way, when marks of a wafer coated with resist are detected as an object, for example, the nonsymmetry of a multiple interference detection pattern caused by irregular resist coatings is improved, thereby assuring a high-accuracy detection hardly affected by the irregular resist coatings.

In the embodiment of the present invention under consideration, it is necessary that the laser beam irradiated on the object be passed through an objective lens or reduction lens. A transmissive object may be irradiated from behind thereof, or a reflective object in dot form may be irradiated obliquely from outside of a lens so as to enable the lens to receive the diffracted light.

Figure 7:
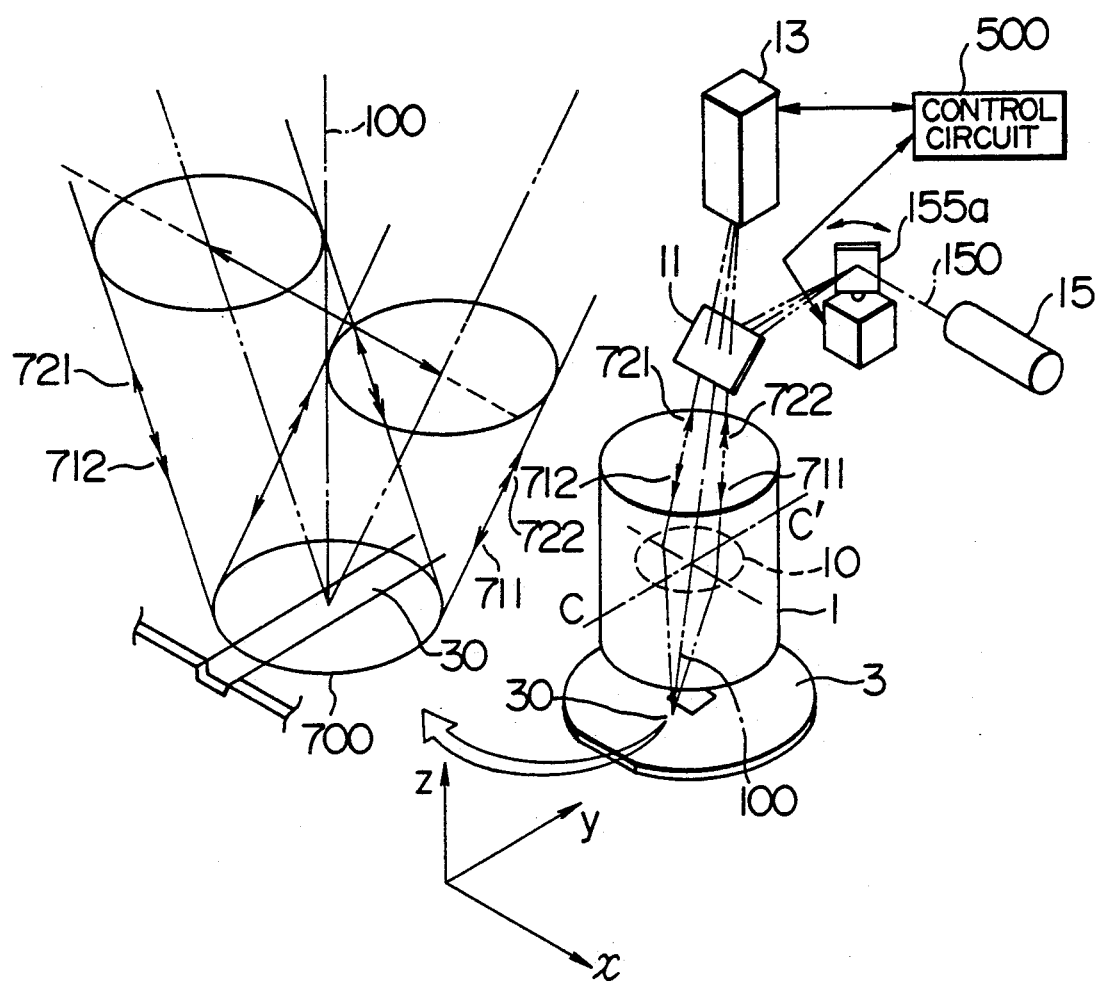
FIG. 7 shows another embodiment of the present invention.

Another embodiment of the present invention will be explained with reference to FIG. 7. A laser beam 150 emitted from a laser source 15 is deflected by a galvanomirror 155a within the range between beams 711 and 712. The galvanomirror 155a is of deflection angle feedback type, or a low-inertia, closed loop and analog servo type, whereby the light is deflected accurately in proportion to the voltage or current value applied from a control circuit 500. The deflected beam is adjusted to scan the pupil 10 of the objective lens 1 in the X direction symmetrically with respect to the pupil center line C—C' (parallel to the Y axis). As a result, the one-dimensional alignment pattern 30 on the wafer 3 is successively illuminated in an oscillatory manner with the illuminating position 700 fixed and the incident angle changed along the ZY plane. The wafer surface is located perpendicular to the optical axis of the objective lens 1, and therefore the regularly-reflected light always scans a paint at the pupil of the objective lens which is symmetrically located with respect to the line C—C' to a point at the pupil of the objective lens which is being scanned by the incident light. As a consequence, as described above, an MTF waveform and a detection waveform shown in by Nos. 4 and 5 of FIG. 8 are detected. If the regularly-reflected light from the pupil 10 is asymmetrical with respect to the line C—C' (Y axis) as shown in No. 3 of FIG. 8 in oscillatory illumination along X axis, the detection waveform would also be asymmetrical. In order to prevent this, the illumination light 711 to 712 is controlled in oscillatory manner along the direction of detection (X direction) (perpendicular to the longitudinal direction of the one-dimensional pattern) by use of the galvanomirror 155a thereby to distribute the regularly-reflected light 721 to 722 symmetrically with respect to the straight line (pupil center line) passing through the center of the pupil 10 of the objective lens 1.

The aforementioned embodiment relates to an example of detection of a pattern on a object like a wafer 3 which is flat from a macroscopic point of view. This invention, however, is not limited to such an object, but is applicable with equal effect to an object with a curved surface. In last-mentioned case, it is also necessary to oscillate the illumination light along the direction of detection (X direction) in such a way that the regularly-reflected light 721 to 722 of the illumination light 711 to 712 entering the parts to be detected are distributed substantially symmetrically along time axis with respect to the straight line 100 passing through the pupil center of the objective lens 1.

Figure 9:
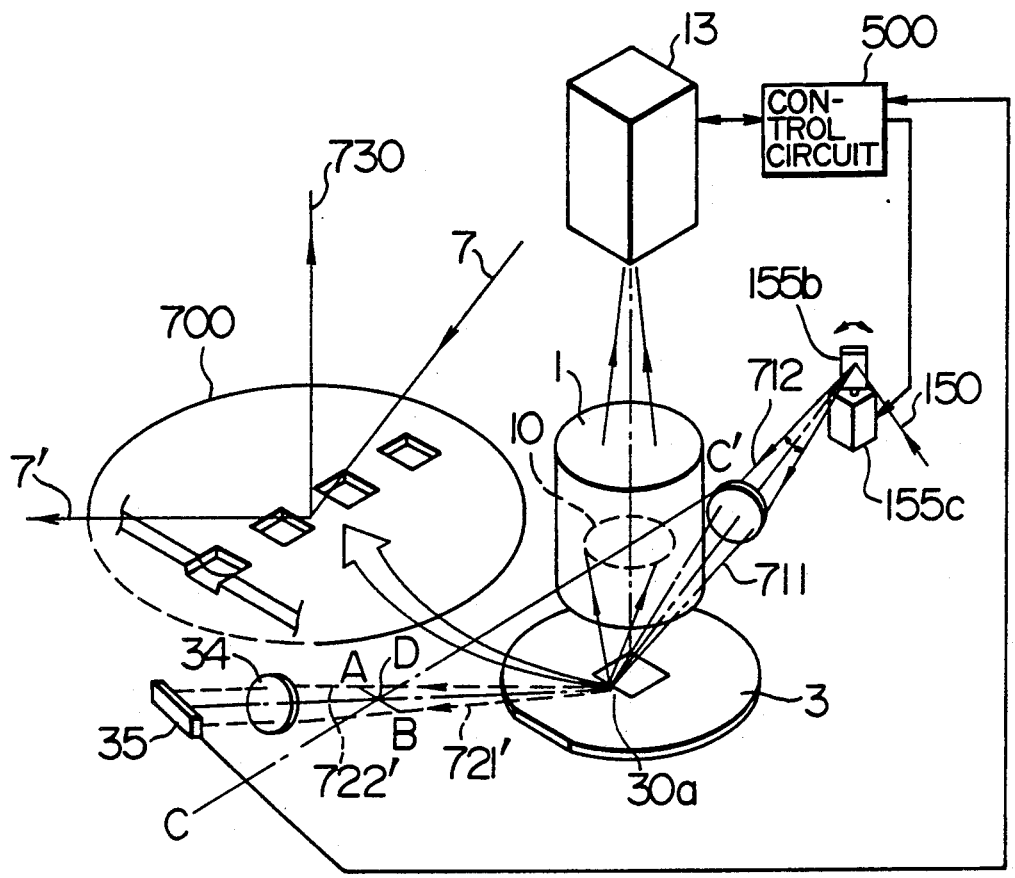
FIG. 9 is a diagram showing another embodiment of the present invention as applied to dark field detection.

Still another embodiment of the present invention is shown in FIG. 9. Specifically, the illumination light rays 711 to 712 are oscillated in such a manner that the regularly-reflected light rays 721' to 722' from the wafer 3 are distributed symmetrically with respect to the line A-B crossing the straight line C—C' passing through the pupil center. In this embodiment, a deflector of feedback type is not used as the galvanomirror 155b. Instead, the present embodiment is so configured that an image of a point D where the center line C—C' parallel to the longitudinal direction of a detection pattern 30a and passing through the center of the pupil 10 of the objective lens 1 crosses a beam scanned by the deflection of the galvanomirror 155b is formed on a one-dimensional sensor (charge-coupled device (CCD) or the like) 35 by a lens 34. For this purpose, the detection signal of the one-dimensional sensor 35 is applied to a control circuit 500, and a drive motor 155c for the galvanomirror 155b is controlled in such a manner that AD equals DB. In this case, the regularly-reflected light rays 721' and 722' do not enter the pupil 10 of the objective lens 1, but the diffracted light 730 enters the pupil 10 permitting detection of a dark field by imaging device 13.

A further embodiment of the present invention is shown in FIG. 10. Specifically, the present invention is applied to the detection of the position of an alignment pattern on a wafer in a reduction projection exposure system. Laser beams of different wavelengths are used as the illumination light. The surface of the galvanomirror 155 is in conjugate relationship with the pattern 30a on the object by means of an image-forming system including 1a, 121, 64 and 65, so that upon deflection of the mirror, a light ray of a wavelength of $\lambda_1$ or $\lambda_2$ may be illuminated on the pattern 30a through the lens system 1a. Further, assume that the deflection angle is changed slightly as shown by 70 and 81 of FIG. 11B, while changing the incident angle relative to the Y axis. Then, as shown in FIG. 11B, the intensity I of the multiple interference occurring between the pattern surface 30b and the surface of the resist 211 coated on the surface 30b, for example, is given by the equation below where t designates the thickness of the resist, $\lambda$ a wavelength, $\theta$ an incident angle and n the refractive index of the resist.

$$I(t,\lambda,\theta) = a + b \cos\left( \frac{4\pi t}{\lambda} \sqrt{n^2 - \sin^2\theta} \right)$$

Figure 11A:
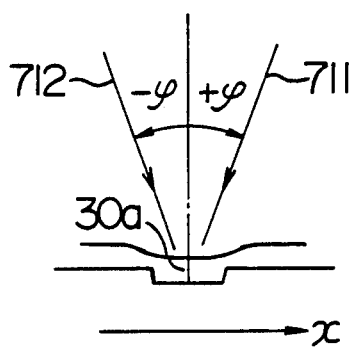

In this equation, a and b are constants having the relationship $a \geq b$. In the presence of a misalignment of the pattern as shown in FIG. 11A, an irregular coating occurs along the peripheral direction when the resist is coated on the wafer by rotary coating machine, with the result that the resist thickness changes depending on whether the right or left part of the misalignment is upstream or downstream of the resist flow. The value of t in the above equation is thus different at the right and left edges, and therefore the detection signal develops an asymmetry. A method for solving this problem was explained with reference to the aforementioned embodiment.

Figure 11B:
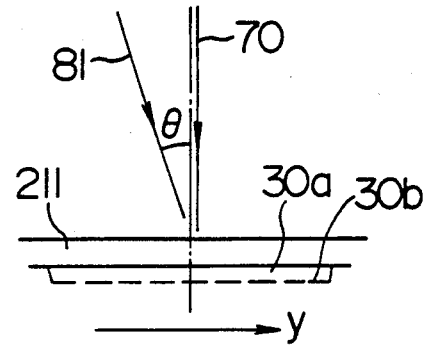

Specifically, as shown in FIG. 11B, the incident angle is set to $\theta_0 (=0°)$ and $\theta_1$ for two wavelengths $\lambda_1$ and $\lambda_2$ and thus by synthesizing a total of four detection waveforms, the asymmetry of the detection waveform is eliminated. The present invention is also applicable to this method in such a manner that the noise of the cut-off frequency is eliminated from the four detection waveforms as mentioned above by the oscillatory illumination along the direction of pattern detection through the galvanomirror 155a, thereby producing a faithful detection waveform of a high S/N with four detection waveforms combined with high symmetry when coating irregularities are present. The alignment of a reduction projection exposure system shown in FIG. 10 will be further explained. An alignment pattern 30a is already recorded adjacently to a circuit chip 31 on the wafer 3. The circuit pattern plotted on the reticle 5 is reduced to one fifth or one tenth in size by a reducing projection lens 1a and superimposed on the circuit pattern chip 31, followed by the exposure to light (through an exposure illumination system not shown). In the process, it is necessary to align the reticle circuit pattern with the already-formed circuit pattern on the wafer to the accuracy 0.2 microns or less. The realization of this accuracy in turn requires accurate detection of the position of the alignment pattern 30a on the wafer 3. As mentioned above, the laser beams of wavelengths $\lambda_1$ and $\lambda_2$ enter the galvanomirror 155 at predetermined angles. The opening 66 is formed so as to pass only one of the wavelengths $\lambda_1$ and $\lambda_2$ as an illumination light and mask the other. The laser beam that has passed the opening 66 thus passes through a lens 65, a galvanomirror 115a, a lens 64, a beam splitter 11 and an image-forming lens 121, and enters the reduction projection lens 1a by way of a mirror 111. The laser beam that has passed through the reduction projection lens 1a is irradiated on the alignment pattern 30a on the wafer 3 at an incident angle already described. The two wavelengths are each irradiated at two incident angles, one perpendicular and the other oblique with respect to the Y axis, while they are subjected to oscillatory illumination along the X direction, so that the noise corresponding to the cut-off frequency is eliminated as mentioned above, thereby producing a faithful detection waveform for each wavelength at each incident angle.

FIGS. 11A and 11B show incident angles of laser beams irradiated on the alignment pattern on the wafer 3 for the wavelengths $\lambda_1$ and $\lambda_2$ of FIG. 10. In FIG. 11A, the laser beam is illuminated in oscillatory manner in such a manner as to change the incident angle in the direction X of detection by a deflector (galvanomirror) 155a shown in FIG. 10 on the alignment pattern 30a. FIG. 11B, on the other hand, shows the manner in which the laser beam is irradiated in the directions perpendicular (70) and oblique (81) with respect to the longitudinal direction (Y axis) of the alignment pattern 30a. The light beam regularly reflected from the wafer surface passe different points of the pupil of the reduction projection lens depending on whether the light beam enters in the direction perpendicular to the Y direction at angle $\theta_0$ or oblique thereto at angle $\theta_1$, resulting in different expansions 71a and 81a of the diffracted light cut (masked) by a circle 10' (pupil image) in FIG. 12. Specifically, the diffracted light 71a of perpendicular incident light beam, as shown in FIG.

Figure 13A:
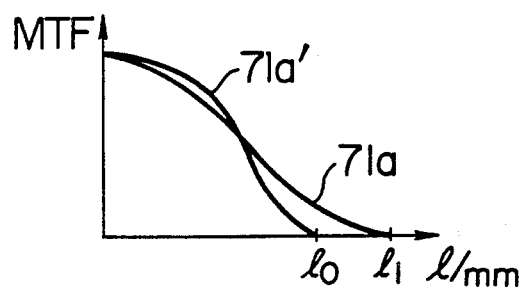
Figure 13B:
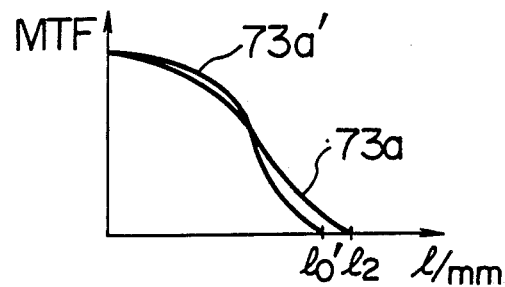

13A, is cut off with a high frequency $l_1$, while the diffracted light beam 73a of the oblique incident light 81 is cut off with a comparatively low spatial frequency $l_2$ as shown in FIG. 13B. As a consequence, the cut-off frequency depends on the incident angle. In the embodiment of FIG. 10, a spatial filter 14d is disposed in the detection light path to secure equal cut-off frequencies. As shown in FIG. 10, the detection light that has been reflected from the wafer 3 passes through the reduction projection lens 1a, and after being reflected on the wafer 3, forms an image of the alignment pattern immediately before a magnifying lens (objective lens) 121. This image is formed again on a pattern detector (imaging means) 13 by the objective lens 121 and the lens 122. The spatial filter 14d arranged backward of the lens 122 is in conjugate relationship with the pupil 10 of the reduction projection lens 1a by means of the image-forming lens 121 and the lens 122, so that the image of this pupil 10 is formed on the spatial filter 14d as shown by circle 10' in FIG. 12. Specifically, the spatial filter 14d is included in the spatial frequency (Fourier transformation) of the alignment pattern 30a, and the openings 140, 141 thereof function to control the spatial frequency of the pattern. As shown in FIG. 12, if a rectangular opening is used for this purpose, the reflected detection light derived from the light illuminated on the alignment pattern 30a with the perpendicular and oblique angles while at the same time being oscillated within the range of $\pm 4°$ of $\pm\delta$=the incident angle as shown in FIG. 11A are passed through the spatial filter 14d at the hatched parts designated by numerals 71a' and 73a' in FIG. 12, so that the MTF becomes substantially the same ($l_0$, $l_0'$) and identical for both incident angles as shown in FIGS. 13A and 13B. The four waveforms corresponding to two wavelengths and two incident angles thus obtained are not subjected to a sharp cut-off at a specific frequency due to the oscillating illumination along the direction of detection (X) as mentioned above, and therefore a faithful waveform is produced which is not superimposed with any noise signal corresponding to the sharp cut-off frequency. As a result, a combined detection waveform can be obtained by appropriately controlling the galvanomirrors 155, 155a and the pattern detector 13 with a control circuit 500 to sequentially or simultaneously combine the four detection waveforms corresponding to two wavelengths and two incident angles. It is thus possible to produce a faithful detection waveform with a high symmetry and low cut-off frequency noise when there are irregularites in the resist coating.

The aforementioned embodiment refers to two wavelengths. The present invention, however, is applicable also with equal effect to a laser beam with three or more wavelengths or a high-directivity light with a continuous range of wavelengths.

In the above-mentioned embodiment of two wavelengths, the opening of the spatial filter is shared by two wavelengths. As an alternative, different detection light paths may be used for different wavelengths with spatial filters of optimum openings respectively. In such a case, the MTF becomes completely identical for the two incident light rays and does not depend on the wavelength when spatial filters having opening widths proportional to the wavelengths are used.

Figure 14:
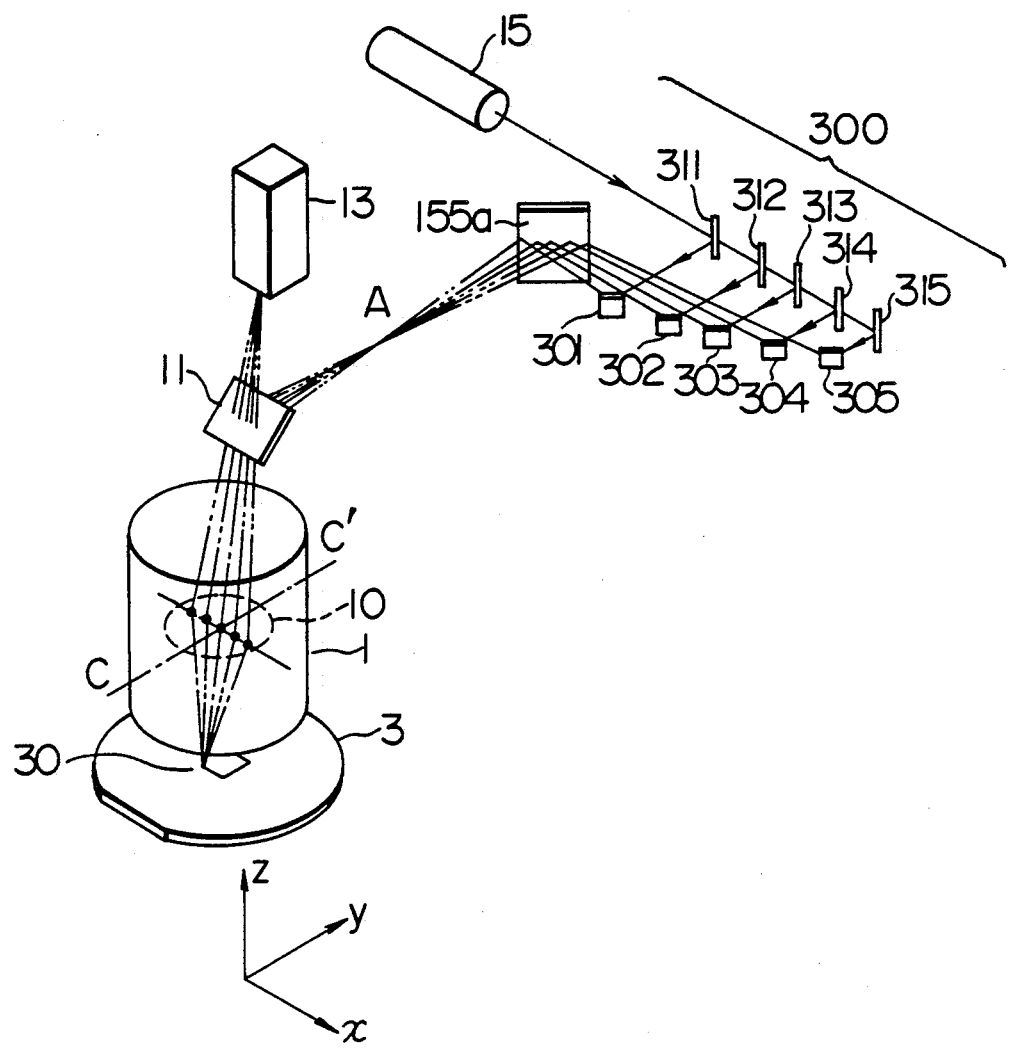
FIG. 14 is a diagram showing a method of illumination according to another embodiment of the present invention.

Another embodiment of the invention is shown in FIG. 14. The component parts identical to those in FIG. 7 are designated by the same reference numerals as in FIG. 7. The point A is located at a position corresponding to the surface of the galvanomirror 155a in FIG. 7 and is in conjugate relationship with the alignment pattern 30 on the wafer. The embodiment under consideration does not use the deflection by the galvanomirror 155a but uses non-interference means 300 to split the beam emitted from the laser source 15 into five (plural) beams with substantially equal amounts of luminous energy by beam splitters 311, 312, 313, 314 and 315. These beams are adapted to be superimposed on each other at point A by mirrors 301 to 305 and 11. The difference in length between any two of the five light paths up to the point A is set to at least the coherent distance of the laser beam. Therefore, five spots are formed on the pupil 10 of the objective lens 1, and the alignment pattern 30 of the wafer 3 is illuminated with different beams simultaneously not interfering with each other and at different incident angles along the X direction. Specifically, this illumination, as compared with the continuous, time-series oscillatory illumination in the embodiment of FIG. 7, corresponds to a dispersed, simultaneous oscillation (or fixing, as one might prefer to call it) type, thus exhibiting the effect of reduction in a specific cut-off frequency noise due to oscillation. The beam may be split into seven to eleven rays more effectively instead of five as in FIG. 14.

Although the embodiment of FIG. 14 has noninterfering laser beams illuminated simultaneously at different incident angles along the direction of detection (X direction), the incident angles may be changed both in X and Y directions. As shown with reference to FIG. 10, for instance, the beams may be caused to enter along the direction of Y axis at inclination angles of 0° (perpendicular) and $\theta_1$. In the process, a galvanomirror may be used for sequential illumination at 0° and $\theta_1$, or the beams may be illuminated at the same time to realize a high-speed illumination and detection. Further, not just a single wavelength, but multiple wavelengths may be illuminated and detected simultaneously along the above-mentioned two directions.

Now, explanation will be made about the case in which the present invention is applied to a reduction projection exposure system including LSI or the like. In view of the fact that the reduction projection lens shown in FIG. 10 is generally corrected only in the vicinity of the exposure wavelength, a color aberration occurs at the wavelength used for alignment detection, so that detection with an alignment light of two or more wavelengths would result in pattern images being formed at different positions on the optical axis (longitudinal color aberration). In contrast, if color compensation is performed by image-forming lenses 121 and 122 or the light path is separated for each detection light to form an image for each wavelength, a multiple-wavelength detection is made possible.

As shown in Nos. 1, 4 and 5 of FIG. 8, the MTF and the detection waveform vary with the range of oscillation along the direction X of detection varies. In an extreme case, No. 1 represents a coherent illumination without any oscillating illumination. In this case, a considerable cut-off frequency noise is superimposed as mentioned above. If the whole pupil is scanned as in the manner of No. 4, on the other hand, a completely coherent illumination is obtained with a reduced MTF in low frequency range, thus decreasing the sharpness of the waveform. Based on these facts, it has been experimentally determined that the pupil should be scanned over a range equal to 0.2 to 0.8 times the effective diameter of the pupil. Then, the above-mentioned problem of concurrent development of coherent and incoherent illumination is overcome, and a high-resolution pattern having a high S/N is produced.

Finally, explanation will be further made about the pattern detector 13 and a method of oscillatory illumination. The pattern detector 13 includes a CCD sensor or a solid-state camera which stores image data received during the image read period. As a result, if the image read scan is stopped, the oscillating illumination is started, an image stored during the oscillating illumination, the oscillating illumination is stopped and the image read scan is effected, then the data obtained is an average of the changing images during the oscillating illumination, thus achieving the object of the present invention. The pattern detector used with the embodiment of FIG. 14 is of course not necessarily provided with a storage effect like this.

It will thus be understood from the foregoing description that according to the present invention, even when an object is illuminated for detection by a laser beam light high in directivity, a smooth detection waveform faithful to the original pattern is produced. The accuracy of detection of the pattern position or pattern recognition is remarkably improved for an improved performance.

Further, according to the present invention, detection with high resolution and low noise faithful to the pattern of the object becomes possible using an illumination light such as a laser beam with high directivity, and therefore a high-accuracy detection of a semiconductor circuit pattern or a linear alignment pattern is realized. This invention is effectively applied especially to the high-speed detection or high-speed pattern inspection using a high intensity laser beam. Furthermore, in the reduction projection exposure system in which the color compensation is substantially impossible over a wide wavelength range, the detection using a laser beam superior in monochromatic characteristic is especially effective. The present invention thus exhibits the greatest effect in such a case as mentioned above overcoming the problems described earlier posed by the laser beam illumination.

We claim:

1. A method of pattern detection comprising the steps of:
    illuminating an uneven pattern to be detected formed on an object with light having a high directivity from a laser source;
    forming an optical image of the pattern from light reflected from the pattern with an imaging optical element having a predetermined modulation transfer function defining a specific spatial cut-off frequency, wherein the optical image contains oscillatory noise caused by the spatial cut-off frequency of the imaging optical element;
    optically reducing the oscillatory noise in the optical image; and
    photoelectrically converting the optical image having reduced oscillatory noise to a pattern detection signal having a waveform which accurately represents the pattern to be detected as a result of the optical reduction of the oscillatory noise in the optical image.

2. A method of pattern detection according to claim 1, wherein the uneven pattern is a one-dimensional pattern.

3. A method of pattern detection according to claim 1, wherein the step of optically reducing the oscillatory noise in the optical image comprises the step of filtering the optical image containing oscillatory noise using a filter means with a portion having an intermediate transmittance which varies in a direction in which the pattern is to be detected to produce an optical image having reduced oscillatory noise.

4. A method of pattern detection according to claim 3, wherein the uneven pattern is a one-dimensional pattern.

5. A method of pattern detection according to claim 3, wherein the step of filtering the optical image containing oscillatory noise is performed substantially at a Fourier transform position of the optical image containing oscillatory noise.

6. A method of pattern detection according to claim 1, wherein the step of optically reducing the oscillatory noise in the optical image comprises the step of distributing the light from the laser source along a line which is symmetric with respect to a plane passing through an optical axis of the imaging optical element to illuminate the pattern at a plurality of incident angles with the light from the laser source, thereby causing an optical image containing oscillatory noise corresponding to each incident angle at which the pattern is illuminated to be formed by the imaging optical element in the forming step, and causing a combination of the optical images containing oscillatory noise to be photoelectrically converted to the pattern detection signal in the converting step, wherein the combination represents an optical image having reduced oscillatory noise.

7. A method of pattern detection according to claim 6, wherein the distributing step comprises the step of oscillating the light from the laser source along the line symmetrically with respect to the plane; and
    wherein the converting step comprises storing and combining the optical images containing oscillatory noise using a storage-type photoelectric converting means while the light from the laser source is being oscillated along the line.

8. A method of pattern detection according to claim 6, wherein the distributing step comprises the steps of:
    providing a plurality of light beams from the light from the laser source; and
    distributing the plurality of light beams along the line symmetrically with respect to the plane.

9. A method of pattern detection according to claim 6, wherein the uneven pattern is a one-dimensional pattern.

10. A pattern detection system comprising:
    a laser source for generating light having a high directivity;
    means for illuminating an uneven pattern to be detected formed on an object with the light from the laser source;
    an imaging optical element having a predetermined modulation transfer function defining a specific spatial cut-off frequency for receiving light reflected from the pattern and for forming an optical image of the pattern from the received reflected light, wherein the optical image contains oscillatory noise caused by the spatial cut-off frequency of the imaging optical element;
    optical noise reducing means for reducing the oscillatory noise in the optical image formed by the imaging optical element; and
    photoelectric converting means for detecting the optical image having reduced oscillatory noise to produce a pattern detection signal having a waveform which accurately represents the pattern to be detected as a result of the reduction of the oscillatory noise in the optical image by the optical noise reducing means.

11. A pattern detection system according to claim 10, wherein the optical noise reducing means comprises filter means with a portion having an intermediate transmittance which varies in a direction in which the pattern is to be detected; and wherein the filter means receives the optical image containing oscillatory noise and outputs the optical image having reduced oscillatory noise.

12. A pattern detection system according to claim 11, wherein the filter means is positioned substantially at a Fourier transform position of the optical image containing oscillatory noise.

13. A pattern detection system according to claim 10, wherein the optical noise reducing means comprises distributing means for distributing the light from the laser source along a line which is symmetric with respect to a plane passing through an optical axis of the imaging optical element to illuminate the pattern at a plurality of incident angles with the light from the laser source, thereby causing the imaging optical element to form an optical image containing oscillatory noise corresponding to each incident angle at which the pattern is illuminated, and causing the photoelectric converting means to detect a combination of the optical images containing oscillatory noise, wherein the combination represents an optical image having reduced oscillatory noise.

14. A pattern detection system according to claim 13, wherein the distributing means comprises means for oscillating the light from the laser source along the line symmetrically with respect to the plane; and wherein the photoelectric converting means is a storage-type photoelectric converting means which stores and combines the optical images containing oscillatory noise while the light from the laser source is being oscillated along the line.

15. A pattern detection system according to claim 13, wherein the distributing means comprises means for producing a plurality of light beams from the light from the laser source and for distributing the plurality of light beams along the line symmetrically with respect to the plane.

16. A pattern detection system according to claim 13, wherein the uneven pattern is a one-dimensional pattern.

17. A reduction projection system comprising:
   a reduction projection lens having a predetermined modulation transfer function defining a specific spatial cut-off frequency for projecting a circuit pattern formed on a mask onto a substrate; and
   an aligning system for aligning the substrate with the projected circuit pattern on the basis of an uneven alignment pattern to be detected formed on the substrate, wherein the aligning system comprises:
   a laser source for generating light having a high directivity; and
   means for illuminating the alignment pattern with the light from the laser source;
   wherein the reduction projection lens receives laser light reflected from the alignment pattern and forms an optical image of the alignment pattern containing oscillatory noise caused by the spatial cut-off frequency of the reduction projection lens; and wherein the aligning system further comprises:
   optical noise reducing means for reducing the oscillatory noise in the optical image formed by the reduction projection lens;
   photoelectric converting means for detecting the optical image having reduced oscillatory noise to produce an alignment pattern detection signal having a waveform which accurately represents the alignment pattern to be detected as a result of the reduction of the oscillatory noise in the optical image by the optical noise reducing means; and
   aligning means for aligning the substrate with the projected circuit pattern in accordance with the alignment pattern detection signal.

18. A reduction projection system according to claim 17, wherein the illuminating means illuminates the alignment pattern with the light from the laser source through the reduction projection lens.

19. A reduction projection system according to claim 17, wherein the uneven alignment pattern is a one-dimensional pattern.

20. A reduction projection system according to claim 17, wherein the optical noise reducing means comprises filter means with a portion having an intermediate transmittance which varies in a direction which the alignment pattern is to be detected; and wherein the filter means receives the optical image containing oscillatory noise and outputs the optical image having reduced oscillatory noise.

21. A reduction projection system according to claim 20, wherein the uneven alignment pattern is one-dimensional pattern.

22. A reduction projection system according to claim 20, wherein the illuminating means illuminates the alignment pattern with the light from the laser source through the reduction projection lens.

23. A reduction projection system according to claim 20, wherein the filter means is positioned substantially at a Fourier transform position of the optical image containing oscillatory noise.

24. A reduction projection system according to claim 20, wherein the filter means has a portion for masking light form the laser source which is regularly reflected form the alignment pattern and transmitted through the reduction projection lens.

25. A reduction projection system according to claim 17, wherein the optical noise reducing means comprises distributing means for distributing the light from the laser source along a line which is symmetric with respect to a plane passing though an optical axis of the reduction projection lens to illuminate the alignment pattern at a plurality of incident angles with the light from the laser source, thereby causing the reduction projection lens to form an optical image containing oscillatory noise corresponding to each incident angle at which the alignment pattern is illuminated, and causing the photoelectric converting means to detect a combination of the optical images containing oscillatory noise, wherein the combination represents an optical image having reduced oscillatory noise.

26. A reduction projection system according to claim 25, wherein the illuminating means illuminates the alignment pattern with the light from the laser source through the reduction projection lens.

27. A reduction projection system according to claim 25, wherein the distributing means comprises means for oscillating the light from the laser source along the line symmetrically with respect to the plane; and wherein the photoelectric converting means is a storage-type photoelectric converting means which stores and combines the optical images containing oscillatory noise while the light from the laser source is being oscillated along the line.

28. A reduction projection system according to claim 27, wherein the oscillating means comprises means for detecting the position of the light from the laser source on the line.

29. A reduction projection system according to claim 25, wherein the aligning system further comprises a relay lens for imaging the optical images containing oscillatory noise formed by the reduction projection lens on the photoelectric converting means.

30. A reduction projection system according to claim 25, wherein the distributing means comprises means for producing a plurality of light beams from the light from the laser source and for distributing the plurality of light beams along the line symmetrically with respect to the plane.

31. A reduction projection system according to claim 30, wherein the means for producing a plurality of light beams produces a plurality of sets of light beams, the light beams in each set having a wavelength which is different from the wavelengths of the light beams in the other sets, and wherein the light beams in each set are distributed along the line symmetrically with respect to the plane.

32. A reduction projection system according to claim 25, wherein the uneven alignment pattern is a one-dimensional pattern.

33. A reduction projection system according to claim 25, wherein the optical noise reducing means further comprises filter means with a portion having an intermediate transmittance which varies in a direction in which the alignment pattern is to be detected.

34. A reduction projection system according to claim 33, wherein the filter means is positioned substantially at a Fourier transform position of the optical images containing oscillatory noise formed by the reduction projection lens.

35. A reduction projection system according to claim 33, wherein the filter means has a portion for masking light from the laser source which is regularly reflected from the alignment pattern and transmitted through the reduction projection lens.

* * * * *